United States Patent [19]

Gemmink et al.

[11] Patent Number: 5,286,584
[45] Date of Patent: Feb. 15, 1994

[54] METHOD OF MANUFACTURING A DEVICE AND GROUP OF MASKS FOR THIS METHOD

[75] Inventors: Jan W. Gemmink; Wilhelmus H. M. Geerts; Marcel Dissel, all of Eindhoven, Netherlands

[73] Assignee: U.S. Philips Corporation, New York, N.Y.

[21] Appl. No.: 966,667

[22] Filed: Oct. 26, 1992

Related U.S. Application Data

[63] Continuation of Ser. No. 629,872, Dec. 19, 1990, abandoned.

[30] Foreign Application Priority Data

Dec. 20, 1989 [NL] Netherlands ............... 8903108

[51] Int. Cl.$^5$ ............................................. G03C 5/00
[52] U.S. Cl. ............................................ 430/5; 430/311
[58] Field of Search ..................... 430/4, 5, 22, 311

[56] References Cited

U.S. PATENT DOCUMENTS 3,413,119 11/1968 St. Clair ........................ 430/22
4,231,811 11/1980 Somekh et al. ................. 437/41
4,246,328 1/1981 Sato ................................. 430/5
4,758,502 7/1988 Banks ........................... 430/332
4,842,969 6/1989 Kawatsuki ........................ 430/5

OTHER PUBLICATIONS

"Seamless Stiching for Large Area Integrated Circuit Manufacturing", Optical/Laser Microlithography, Burn J. Lin, Editor, Proc. Spie, 922, pp. 188-193.

Primary Examiner—Marion E. McCamish
Assistant Examiner—Kathleen Duda
Attorney, Agent, or Firm—Steven R. Biren

[57] ABSTRACT

A method and group of masks for manufacturing a device whereby illumination of a photoresist layer (4) takes place by subsequent illumination through partial masks (1) and 2). During these separate illuminations, complementary scales of grey are obtained in the connection region (7, 8) of the images (5, 6), the total illumination in the connection region (7, 8) being nevertheless complete. According to the invention, good results are obtained when the partial masks (1) and (2) have complementary transparency gradients in the ends (9, 10) corresponding to the scales of grey.

6 Claims, 1 Drawing Sheet

METHOD OF MANUFACTURING A DEVICE AND GROUP OF MASKS FOR THIS METHOD

This is a continuation of application Ser. No. 629,872, filed Dec. 19, 1990, now abandoned.

BACKGROUND OF THE INVENTION

1. Field of the Invention

The invention relates to a method of manufacturing a device whereby in a photolithographic treatment subsequently at least two partial masks are aligned relative to the same substrate and a photoresist layer is illuminated through these partial masks in order to obtain connected images having an overlapping connection region, a first illumination through a first partial mask at the connection region forming first halves of details in the photoresist layer with increasing scales of grey towards their ends (decreasing illumination), and a second illumination through a second partial mask forming second halves of the details in the photoresist layer corresponding to the first halves with increasing scales of grey (decreasing illumination) towards their ends, which overlap the ends mentioned above, these scales of grey being complimentary to the scales of grey formed during the first illumination, so that in total a complete illumination of the details is obtained by the two illuminations.

The overlapping connection area is thus formed by ends of halves of details imaged in the photoresist layer.

2. Description of the Related Art

A method of the kind described in the opening paragraph is known from J. P. Rominger "Seamless Stitching for Large Area Integrated Circuit Manufacturing" Optical/Laser Microlithography, Burn J. Lin, Editor, proc. SPIE, 922, pp. 188-14 193 (1988).

Increasingly small details are required in the manufacture of integrated semiconductor circuits, for which imaging systems with high resolution are used, the so-called wafer steppers.

The imaging field of a stepper, however, is limited in size. Since increasingly large surface areas are required for the integrated circuits, it can happen that a semiconductor device no longer fits the imaging field. If such a device is to be manufactured nevertheless, the mask may be split up into various partial masks and the partial masks may subsequently be imaged on a slice of semiconductor material.

In order to let corresponding details of the circuit merge fluently into one another in the case of illumination through subsequent partial masks, the ends of details of adjoining images are given complementary scales of grey at the area of their connection region.

The publication mentioned above describes how the scales of grey are obtained by giving the mask used an extra mask which is not in the object plane of the imaging system, so that half-shadow is obtained in the image plane.

This last-mentioned manufacturing method has a number of disadvantages:

1. Extra process steps are required for manufacturing the masks.
2. In the case of imaging systems which are not telecentric, the position of the half-shadow in the image plane relative to the connection region depends on the distance between the connection region and the optical axis of the imaging system.
3. Corresponding ends of partial masks must end on a straight connection line. This limits the possibilities for circuit design. A connection line is a line which connects and divides into two the ends of adjoining details in a partial mask and which runs practically parallel to the nearby edge of the partial mask in these ends.
4. Connections between ends of partial masks which run parallel to a connection line are not very well possible.
5. A very wide connection region is required between adjoining images, i.e. in the order of 150–1000 $\mu$m.

SUMMARY OF THE INVENTION

The invention has for its object inter alia to obviate the above disadvantages to at least a substantial degree.

According to the invention, therefore, the method as described in the opening paragraph is characterized in that the complementary scales of grey are obtained by illumination through partial masks having negative gradients of transparency in the ends of transparent regions, which gradients correspond to the increasing scales of grey to be achieved.

The invention is based on the recognition that the said disadvantages can be practically avoided by the use of partial masks in which gradients in transparency are present in the translucent portions.

No extra process steps are necessary in mask manufacture for this. In the case of imaging systems which are not telecentric at the mask end, moreover, the position of the half-shadow in the image field relative to the connection region is independent of the distance between the connection region and the optical axis of the imaging system.

The connection region between adjoining images need no be wider than 10 $\mu$m in the method according to the invention.

The invention also relates to a group of masks comprising at least two partial masks in which each of the partial masks has at least one peripheral region for obtaining an overlapping connection region in a photoresist layer, the two peripheral regions comprising ends of transparent regions whose ends in the one peripheral region correspond to ends in the other peripheral region.

According to the invention, the mutually corresponding ends of the transparent regions have complementary negative transparency gradients.

In the group of masks according to the invention, and in contrast to that according to the present art, it is possible for the connection line in the partial masks to have a serrated shape or for the ends in the partial masks to run parallel to the connection line.

Peripheral regions in a mask according to the invention can be very narrow (for example approximately 10 $\mu$m).

Such a mask, therefore, is preferably used in the manufacture of a semiconductor device.

The use of the group of masks according to the method, however, is not limited to the manufacture of a semiconductor device.

The method and the group of masks according to the invention may also be used, for example, in the manufacture of a liquid-crystal display device. It is true that the details to be pictured are much greater here, but the fact that much greater surfaces are to be mutually aligned is also a problem here, so that it is equally advantageous here to implement the method and the group of masks according to the invention.

The term group of masks is used here to make a distinction with a term like, for example, set of masks in order to indicate that a group of masks consists of partial masks meant to realise the illumination of one device in a single photoresist layer.

By complementary transparency gradients is meant that at each and every point of the photoresist layer to be illuminated in the connection regions the sum of the transparencies of the partial masks equals 1, so that in each such point the scales of grey cancel one another out after the two illumination operations.

A group of masks according to the invention is generated by means of a mask generator in manufacture.

In an embodiment of the group of mask according to the invention, the transparency gradient of the ends of the transparent regions in the peripheral regions of the partial mask is a continuous one. In such a group of masks the partial mask preferably consist of stabilized silver precipitates in glass substrates with an increase in the silver concentration in the ends of transparent regions corresponding to the negative transparency gradient.

Generally, the term transparency gradient of the partial masks should be understood to mean that the transparency of the ends of the peripheral regions of the partial masks runs continuously for practical purposes as regards its effect on the illumination of the photoresist layer.

In an embodiment of the group of masks according to the invention, accordingly, the ends of the transparent regions in the peripheral regions of the partial masks preferably comprise discrete regions which are impermeable to light and which increase in number and/or size, and which are pictured continuously with the required negative transparency gradients owing to the limitation of the resolving power of the imaging system to be used. In such a group of masks, the partial masks often consist of a chromium layer having the required patterns for the partial masks on a transparent substrate. The intensity of the irradiation need not be changed when such a group of masks is generated with a mask generator.

The group of masks comprising partial masks having silver precipitates in glass substrates may also be constructed with discrete regions at the ends which are impermeable to light.

The invention will now be explained in more detail with reference to an embodiment and the accompanying drawing.

BRIEF DESCRIPTION OF THE DRAWINGS

In the drawing, FIGS. 1a and 1b diagrammatically represent a cross-section of a portion of the device in subsequent stages of manufacture by the method according to the invention.

DETAILED DESCRIPTION OF THE PREFERRED EMBODIMENTS

Figure 1A:
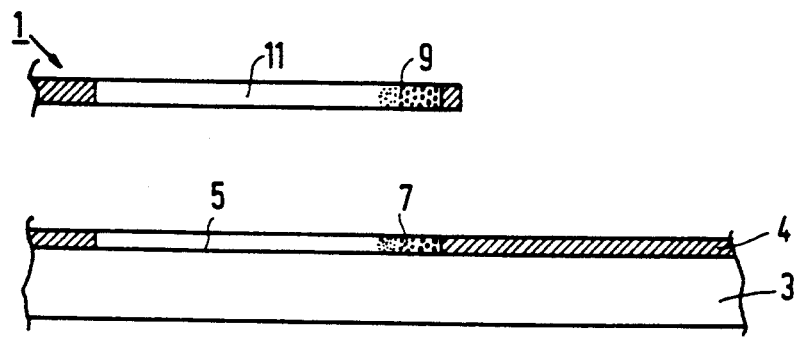
Figure 1B:
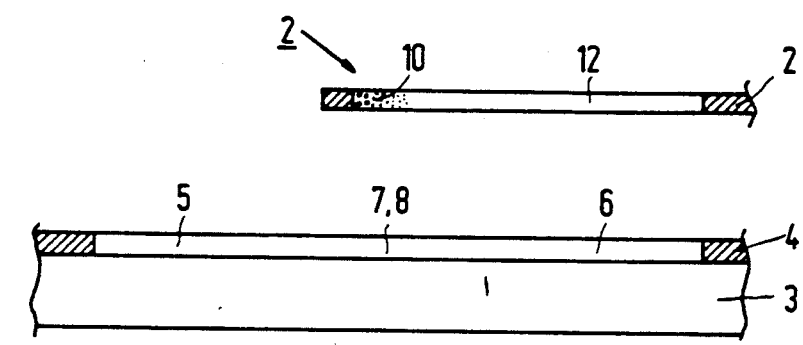

A device is manufactured (see FIGS. 1a and 1b) by the method described in the opening paragraph, for example a semiconductor device such as an image sensor for a television camera, at least two partial masks 1 and 2 being aligned one after the other relative to the same substrate 3, for example a silicon slice, in a photolithographic operation, upon which a photoresist layer 4 is illuminated through these partial masks 1 and 2 to obtain adjoining images 5, 6 with an overlapping connection region 7, 8.

This illumination may be carried out in usual manner by means of a wafer stepper.

To this end, first halves 5 of details in the photoresist layer 4 are formed with increasing scales of grey (decreasing illumination) in their ends 7 by a first illumination through a first partial mask 1 in the connection region 7, 8, after which a second illumination through a second partial mask 2 forms second halves 6 of details in the photoresist layer 4 corresponding to the first halves 5 with increasing scales of grey (decreasing illumination) which are complementary to the scales of grey formed during the first illumination in their ends 8 which overlap the ends 7 referred to above, the two illuminations giving a full overall illumination of the details in the connection region 7, 8.

According to the invention, the complementary scales of grey are obtained by illumination through partial masks 1, 2 which have negative transparency gradients in ends 9, 10 of transparent regions 11, 12 corresponding to the increasing scales of grey to be achieved.

It should be noted that patterns of the partial masks are often imaged in the photoresist layer on a reduced scale. This has not been shown in the picture for the sake of clarity. The photoresist layer 4 may be a usual positive photoresist layer and the substrate 3 may be a silicon slice which, for example, may already have been subjected to usual treatments in deposition and etching stages.

Figure 2:
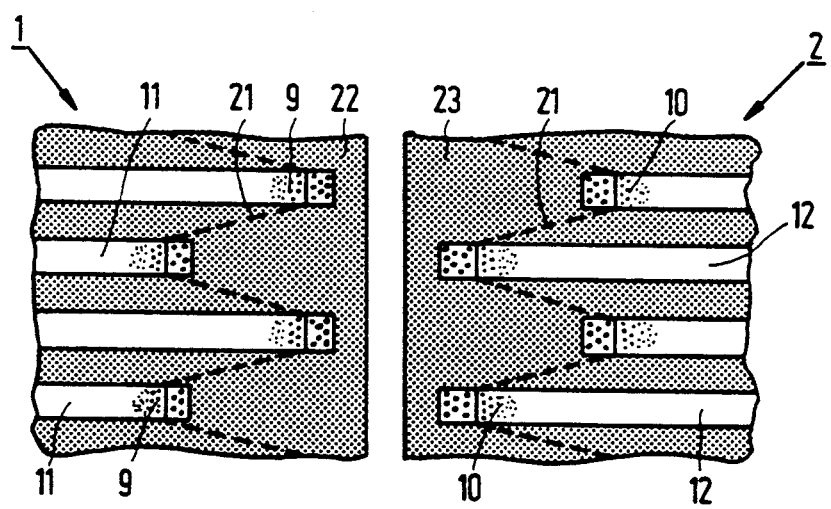
FIG. 2 diagrammatically shows a plan view of a portion of a group of masks according to the invention.
Figure 3:
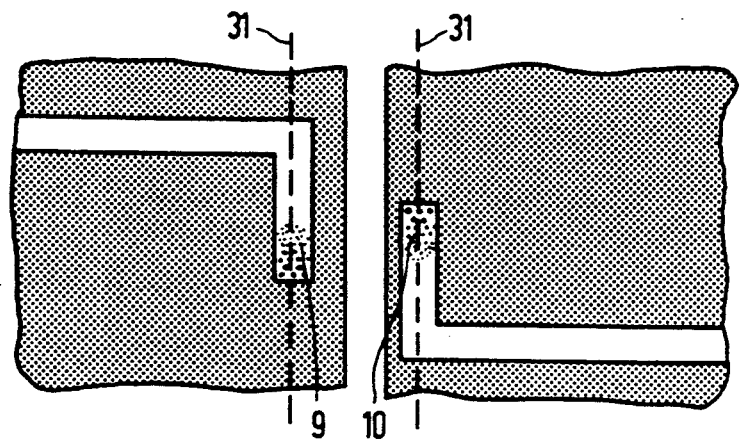
FIG. 3 diagrammatically shows a plan view of a portion of another group of masks according to the invention.

In the method according to the invention, a group of masks (see FIG. 2) is used having at least two partial masks 1 and 2, each of the partial masks having at least one peripheral region 22, 23 to obtain an overlapping connecting region 7, 8 in the photoresist layer 4, ends 9, 10 of transparent regions 11, 12 being present in the two peripheral regions 22 and 23, so that ends 9 in the one peripheral region 22 correspond to ends 10 in the other peripheral region 23.

According to the invention, the mutually corresponding ends 9, 10 of the transparent regions 11, 12 have complementary negative transparency gradients.

It is possible for the connection line 21 of the partial mask to have a serrated shape in the group of masks according to the invention.

It is also possible for the ends 9, 10 in the partial masks to run parallel to the connection line 31 (see FIG. 1).

The group of masks is manufactured in a usual manner by means of a mask generator.

The ends 9, 10 of the transparent regions 11, 12 in the peripheral regions 22, 23 of the partial masks 1, 2 comprise, for example, discrete regions on a glass substrate which are impermeable to light and which increase in number and/or size, for example in a chromium pattern. The discrete regions are of such a size that they can be imaged continuously with the desired transparency gradient in a usual manner owing to the limitation of the resolving power of the imaging system to be used.

If so desired, more than two, for example four, partial masks may be used. Positive as well as negative photoresist materials may be used in the method according to the invention.

We claim:

1. A group of masks comprising at least two partial masks in which each of the partial masks has at least one peripheral region for obtaining an overlapping connection region in a photoresist layer illuminated through said partial masks, the at least two peripheral regions comprising ends of transparent regions whose ends in the one peripheral region correspond to ends in the other peripheral region, characterized in that the mutually corresponding ends of the transparent regions have complementary negative transparency gradients.

2. A group of masks as claimed in claim 1, characterized in that a connection line between the partial masks has a serrated shape in the plane of the masks.

3. A group of masks as claimed in claim 1, characterized in that the ends of the partial masks run parallel to the connection line.

4. A group of masks as claimed in claim 1, characterized in that the ends of transparent regions of the peripheral regions of the partial masks comprise discrete regions which are impermeable to light and which increase in at least one of number and size, and which appear continuous owing to the limitation of the resolving power of the imaging system to be used.

5. A group of masks as claimed in claim 4, characterized in that the partial masks comprise stabilized silver precipitates in glass substrates with an increase in the silver concentration in the ends of the transparent regions corresponding to the negative transparency gradient.

6. A group of masks as claimed in claim 1 characterized in that a transparency gradient of the ends of the transparent regions in the peripheral regions of the partial masks is a continuous one.

* * * * *